United States Patent [19]

Ichikawa et al.

[11] Patent Number: 4,764,767
[45] Date of Patent: Aug. 16, 1988

[54] ABSOLUTE ROTATIONAL POSITION DETECTION DEVICE

[75] Inventors: Wataru Ichikawa, Tokyo; Yuji Matsuki, Sayama, both of Japan

[73] Assignee: Kabushiki Kaisha SG, Tokyo, Japan

[21] Appl. No.: 899,517

[22] Filed: Aug. 22, 1986

[30] Foreign Application Priority Data

Aug. 27, 1985 [JP] Japan .................. 60-187901

[51] Int. Cl.[4] .............................................. G08C 19/06
[52] U.S. Cl. ................... 340/870.31; 324/174; 324/208; 336/45; 336/135
[58] Field of Search ............ 340/870.31, 870.32, 340/870.35, 870.36; 336/135, 45; 324/208, 207, 173, 174, 166

[56] References Cited

U.S. PATENT DOCUMENTS

| 3,132,337 | 5/1964 | Martin .................. 324/174 |
| 3,810,136 | 5/1974 | Lang et al. ............ 340/870.35 |
| 4,274,053 | 6/1981 | Ito et al. .............. 324/208 |
| 4,604,575 | 8/1986 | Shimizu et al. ........ 324/162 |

FOREIGN PATENT DOCUMENTS 1473854 2/1969 Fed. Rep. of Germany ...... 324/208

Primary Examiner—John W. Caldwell, Sr.
Assistant Examiner—Tyrone Queen
Attorney, Agent, or Firm—Spensley Horn Jubas & Lubitz

[57] ABSTRACT

On a circumferential side surface of a single cylindrical member constituting a main body of a rotor section are disposed, in parallel, a first pattern which repeats change in the circumferential direction with a predetermined pitch and a second pattern which has a change of one cycle with respect to one circumference. A detection head section which is provided in proximity to the rotor section changes its relation of correspondence to the respective patterns in accordance with rotational position of the rotor section and produces output signals corresponding to the relation of correspondence. A relatively rough absolute value of a rotational position within one rotation is established by an output signal produced in response to the second pattern and its accuracy is established with a high resolution by an output signal produced in response to the first pattern. By disposing the first and second patterns in parallel on the single cylindrical member of the rotor section, the construction of the device can be simplified.

10 Claims, 4 Drawing Sheets

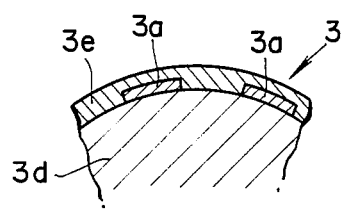
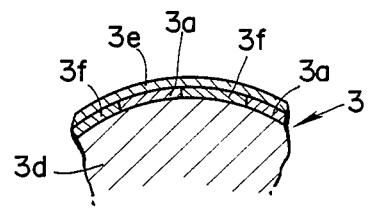
FIG.10   FIG.11
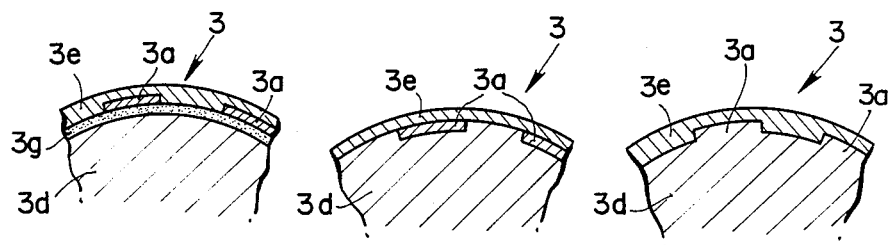
FIG.12   FIG.13   FIG.14

ABSOLUTE ROTATIONAL POSITION DETECTION DEVICE

BACKGROUND OF THE INVENTION

This invention relates to an absolute rotational position detection device capable of detecting an absolute value of a rotational position of a motor or other rotating elements in a high resolution of detection.

As an induction type rotational position detector of a type in which primary and secondary windings are provided on a stator side and no winding is provided on a rotor side, known in the art, on one hand, is a rotational type differential transformer of a type which produces an output signal having a voltage level corresponding to a rotational position and, on the other hand, there is a device as disclosed in U.S. Pat. No. 4,604,575 which produces an AC signal having an electrical phase angle corresponding to the rotational position. For improving resolution of detection of such induction type rotational position detection device, it is conceivable to form teeth respectively in a stator and a rotor and cause a permeance change to be produced between the stator and the rotor in such a manner that one pitch of these teeth constitutes one cycle of the permeance change. According to this arrangement, one cycle of change in the output signal corresponds to one pitch of the teeth with resulting improvement in the resolution of detection. This arrangement, however, enables only a relative rotational position within one pitch of the teeth to be detected and so it is insufficient for detecting an absolute rotational position within one rotation. Hence, a second detection device of an inferior resolution which is capable of detecting an absolute rotational position for at least each teeth is required in addition to the detection device provided with the teeth. By providing such second detection device, an absolute value of rotational position can be detected with a high resolution by combining an absolute rotational position for each teeth with a relative rotational angle within one pitch of the teeth. This is disclosed in the above mentioned U.S. Pat. No. 4,604,575. It is apparently expensive, however, to separately construct the toothed detection device of a high resolution and the second detection device of a low resolution and merely arrange these two devices in parallel. There also arises an inconvenience that centering of rotor sections of the two devices must be conducted in high precision. For facilitating this centering, it has been proposed in Japanese Preliminary Utility Model Publication No. 92108/1982 to form the teeth on the rotors in a spiral form to enable a rotational position detection in which one pitch of the teeth constitutes one cycle and a rotational position detection in which one rotation of the spiral constitutes one cycle. This however requires a high-precision machining of the rotors.

It is, therefore, an object of the invention to provide an absolute rotational position detection device capable of detecting an absolute rotational position over the entire circumference of one rotation with a high resolution and yet with a simple construcion.

SUMMARY OF THE INVENTION

The absolute rotational position detection device according to the invention is characterized in that it comprises a rotor section having a first pattern which repeats change in the circumferential direction with a predetermined pitch and a second pattern which has a change of one cycle with respect to one circumference, these patterns being formed with a predetermined material and disposed in parallel on a circumferential side surface of a single cylindrical member, and a detection head section provided in proximity to this rotor section whose relation of correspondence to the respective patterns changes in accordance with its positional relation with respect to the rotor section and which produces output signals corresponding to the relation of correspondence with respect the respective patterns.

According to the invention, in response to the first pattern disposed on the rotor section, a rotational angle range corresponding to one pitch of the repetition of the first pattern is made one cycle and an absolute rotational position detection within this range can be performed cyclically. This enables a rotational position detection with a high resolution. On the other hand, in response to the second pattern disposed on the rotor section, an absolute rotational position detection can be performed within one rotation. In the foregoing manner, a rotational position detection with a high resolution based on the vernier principle can be made, employing a position detection signal produced in response to the first pattern as vernier data and a position detection signal produced in response to the second pattern as main scale data.

Since in the rotor section, the two types of patterns are provided by a predetermined material (e.g., a conductor such as copper or aluminum or a magnetic substance such as iron) and are disposed in parallel on the circumferential side surface of one cylindrical member, the construction is very simple and requires little skill in the manufacture.

Preferred embodiments of the invention will now be described with reference to the accompanying drawings.

BRIEF DESCRIPTION OF THE DRAWINGS

In the drawings,

FIGS. 10 through 14 are respectively sectional views showing specific examples of process for forming the patterns on the rotor section.

DESCRIPTION OF PREFERRED EMBODIMENTS

Figure 1:
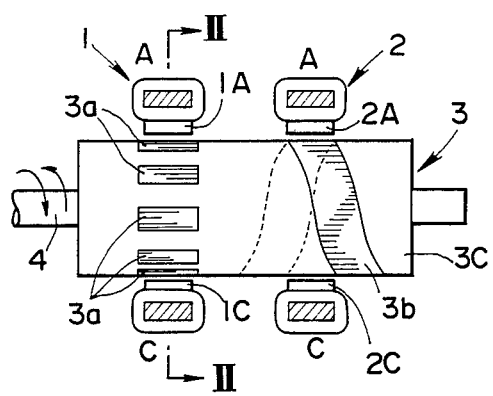
FIG. 1 is a partly sectional side view showing an embodiment of the absolute rotational position detection device according to the invention.
Figure 2:
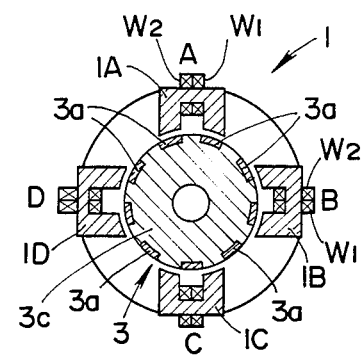
FIG. 2 is a sectional view taken along lines II—II in FIG. 1.

The rotational position detection device shown in FIGS. 1 and 2 comprises first and second detection heads 1 and 2 which are disposed in a fixed relationship to each other in predetermined positions and a rotor section 3 which is inserted in these detection heads 1 and 2 and is rotated in accordance with the rotation imparted to a rotation shaft 4. In FIG. 1, the rotor section 3 is shown in side elevation and the detection heads 1 and 2 in section. The main body of the rotor section 3 consists of a single cylindrical member and on the circumferential side surface of this cylindrical member are disposed a first pattern which repeats change in the circumferential direction with a predetermined pitch and a second pattern which has one cycle of change with respect to one circumference. These patterns are disposed in parallel with each other and are formed with a predetermined material (i.e., a material which responds to magnetism in some way).

The first pattern in the rotor section 3 consists of N oblong pieces 3a made of a predetermined material arranged about the cylindrical member with an equal interval therebetween. The pitch of repetition of this first pattern is 360/N degrees (in the illustrated example, N being 9). The second pattern consists of a spiral strip 3b of a predetermined width disposed in a spiral form for one pitch about the cylindrical member of the rotor section 3.

The first detection head 1 is disposed in correspondence to the first pattern 3a and the second detection head 2 is disposed in correspondence to the second pattern 3b. FIG. 2 shows the first detection head 1 and a part of the rotor section 3 on which the first pattern 3a is disposed in a section taken along lines II—II in FIG. 1. As will be apparent from FIG. 2, the detection head 1 consists of four poles 1A-1D which are disposed in the circumferential direction with an interval of 90 degrees therebetween. A primary coil W1 and a secondary coil W2 are wound on each of these poles 1A-1D. The respective poles 1A-1D have a C-shaped magnetic substance core and a flux coming out of one end of each core enters the other end thereof through the rotor section 3. The second detection head 2 likewise respectively have four poles 2A-2D and may have a similar construction to the first detection head 1. The relation of correspondence between the poles 1A-1D of the first detection head 1 and the oblong pieces 3a of the first pattern of the rotor section 3 is such that the oblong pieces 3a are shifted by ¼ pitch between adjacent poles. In this case, one pitch of the pattern change is 360/N degrees (40 degrees in case of N=9) as described previously. The relation of correspondence between respective poles 2A-2D of the second detection head 2 and the spiral strip 3b of the second pattern of the rotor section 3 is also such that the strip 3b is shifted by ¼ pitch between adjacent poles. In the case of the second pattern, however, one pitch of the pattern change corresponds to one rotation (360 degrees). Owing to such shifting in the corresponding relationship between the poles and the patterns, reluctance of magnetic paths passing through the respective poles 1A-1D and 2A-2D changes with different phases. Description will now be made on the assumption that the poles 1A and 2A have phase A, the poles 1B and 2B have phase B, the poles 1C and 2C have phase C and the poles 1D and 2D have phase D.

The material constituting the patterns of the rotor section 3 is one which causes reluctance change to be varied depending upon extent of entering of this material in the magnetic field of the detection heads. For such material, a material which is a better conductor than other portion 3c of the rotor section 3 or magnetic substance can preferably be employed.

Let us assume that the patterns 3a and 3b of the rotor section 3 are constructed of a good conductor such as copper and the other portion 3c of a material which is less conductive than this good conductor (e.g., iron). As the rotor section 3 is displaced by rotation and the oblong piece 3a of the first pattern enters the magnetic field of the respective poles 1A-1D of the first head 1 in accordance with the amount of displacement of the rotor section 3, an eddy current flows through the oblong piece 3a consisting of a good conductor in accordance with the extent of entry of the oblong piece 3a into the magnetic field. The larger the area of the oblong piece 3a opposing the poles 1A-1D (e.g., a state in which the oblong piece 3a opposes the pole 1A for the phase A in FIG. 2 at the maximum), the larger is the eddy current which flows. In a state in which the oblong piece 3a does not oppose the end portion of the poles 1A-1D (e.g., a state in which the oblong piece 3a opposes the pole 1C for the phase C), little eddy current flows through the oblong piece 3a. Thus, in accordance with the area of the good conductor oblong piece 3a of the rotor section 3 opposing the end portion of the poles for the respective phases of the first detection head 1, the eddy current flows through the oblong piece 3a in its opposing portion and resulting reluctance change due to the eddy current loss is produced in the magnetic circuits of the poles 1A-1D of the first detection head 1. In each secondary winding W2 of the poles 1A-1D, an AC signal having a peak level corresponding to the reluctance is induced. Owing to shifting in the corresponding relationship between the poles 1A-1D and the oblong piece 3a, the reluctance change in the respective poles 1A-1D is shifted by ¼ cycle between the adjacent poles, one cycle consisting of an angle of one pitch of repetition of the oblong pieces 3a. If, for example, the phase A is a cosine phase, the phase B is a sine phase, the phase C is a minus cosine phase and the phase D is a minus sine phase.

In accordance with the magnitude of the reluctance, a relative rotational position of the rotor section 3 with respect to the first detection head 1 can be detected in an absolute value within the angular range of one pitch of the first pattern. In a case where this detection is made by employing the phase system, the primary windings for the phases A and C are excited by the sine signal sin ωt and the primary windings for the phases B and D are excited by the cosine signal cos ω. As a result, as a detection head output signal Y1 which is a composite signal of induced voltages of the secondary windings for the respective phases, an AC signal $$Y1 = K \sin(\omega t + \phi) \qquad (1)$$

can be obtained. φ represents a phase angle corresponding to the rotational position of the rotor section 3 within the range of an angle (360/N) which is for one pitch of the first pattern. If an actual rotation angle of the rotor seciton 3 is represented by θ, there is a relation $\phi = N\theta$. K is a constant determined in accordance with various conditions. Thus, the phase shift amount $\phi$ with respect to the reference AC signal sin $\omega t$ of the first detection head output signal Y1 represents the rotational position of the rotor section 3 within the angular range of one pitch of the first pattern. This phase shift amount $\phi$ can be measured digitally or in analog by a suitable measuring means.

The same is the case with the second pattern. When the flux of the poles 2A-2D of the second detection head 2 passes through a part of the spiral strip 3b, an eddy current flows in this part and reluctance change corresponding thereto is produced in the magnetic circuit in the respective poles. The larger the area of the spiral strip 3b opposing the end portion of the poles 2A-2D, the larger is the amount of the eddy current which flows. Thus, reluctance in the poles 2A-2D of the second detection head 2 changes with its one cycle consisting of the angular range of one pitch of the spiral strip 3b, i.e., 360 degrees, so that phase of the reluctance change is shifted by 90 degrees between adjacent poles. Accordingly, as in the case of the above described head 1, the reluctance change is such that if the pole 2A for the phase A is a cosine phase, the pole 2B is a sine phase, the pole 2C is a minus cosine phase and the pole 2D is a minus sine phase.

Figure 3:
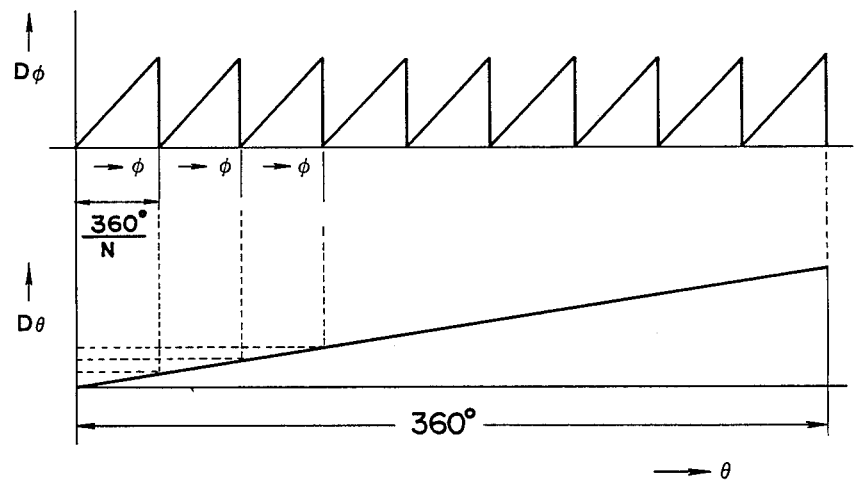
FIG. 3 is a graph showing an example of position detection data obtained on the basis of outputs of first and second detection heads in the embodiment shown in FIG. 1.

In accordance with the magnitude of the reluctance, the rotational position of the rotor section 3 with respect to the second head 2 can be detected in an absolute value within one cycle of the change of the second pattern (i.e., one rotation). In a case where this detection is made by employing the phase system, the primary windings for the phases A and C are excited by the sine signal sin $\omega t$ and the primary windings for the phases B and D by the cosine signal cos $\omega t$ in the same manner as described above. As a result, as a detection head output signal Y2 which is a composite signal of induced voltages of the secondary windings of the respective poles, an AC signal $$Y2 = K \sin(\omega t + \theta) \qquad (2)$$

can be obtained. $\theta$ represents a phase angle corresponding to the rotational position of the rotor section 3 within the angular range of one cycle of the second pattern. Thus, the phase shift amount $\theta$ with respect to the reference AC signal sin $\theta t$ of the second head output signal Y2 represents the rotational position of the rotor section 3. This phase shift amount $\theta$ can also be measured digitally or in analog by a suitable measuring means. Rotational position detection data D$\phi$ derived from the first head output signal Y1 and rotational position detection data D$\theta$ derived from the second head output signal Y2 are shown in FIG. 3. The first rotational position detection data D$\phi$ represents an absolute rotational position within the relatively narrow angular range (360/N degrees). The data D$\phi$ corresponds to vernier measured data in the vernier principle and is capable of accurate position detection with a high resolution. The second rotational position detection data D$\theta$ represents an absolute rotational position within the complete circumference of one rotation. The data D$\theta$ may be data of a rough resolution because accuracy of detection within the angular range of 360/N degrees can be expected from the first rotational position detection data D$\phi$. In other words, the second rotational position detection data D$\theta$ may be of a rough resolution of such a degree as to be able to obtain an absolute value with a minimum unit of 360/N degrees. This data corresponds to main-scale measured data in the vernier principle. By combination of the first and second rotational position detection data D$\phi$ and D$\theta$, absolute rotational position detection data of a high resolution based on the vernier principle can be obtained over a wide range.

Figure 4:
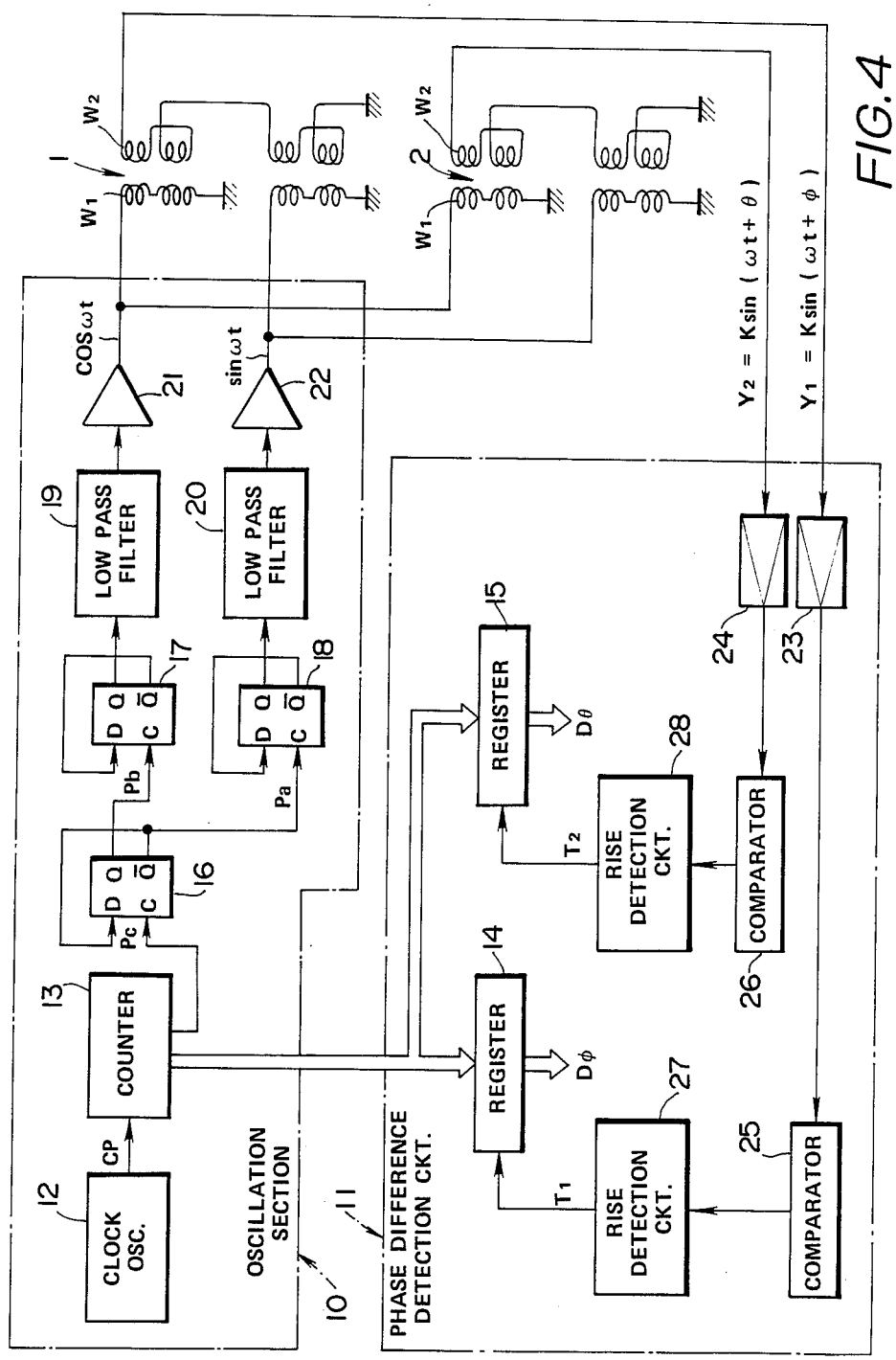
FIG. 4 is an electrical block diagram showing an example of a circuit for supplying an exciting AC signal to the detection head section and an example of a circuit for detecting an electrical phase of the output signals of the head section to obtain the position detection data.

An example of an electrical circuit for producing the detection head output signals Y1 and Y2 in accordance with the above described phase system and measuring the phase shift amounts $\phi$ and $\theta$ in these output signals is shown in FIG. 4.

In FIG. 4, an oscillator section 10 is a circuit for generating the reference sine signal sin $\omega t$ and cosine signal cos $\omega t$ and a phase difference detection circuit 11 is a circuit for measuring the phase shift amounts $\phi$ and $\theta$. A clock pulse CP generated by a clock oscillator 12 is counted by a counter 13. The counter 13 is of a suitable modulo M (M being any integer) and its count value is supplied to registers 14 and 15. From a 4/M frequency divided output of the counter 13 is taken out a pulse Pc which is a 4/M frequency divided signal of the clock pulse CP and supplied to a C input of a flip-flop 16 which functions as a two divider. A pulse Pb provided from a Q output of the flip-flop 16 is applied to a flip-flop 17 and a pulse Pa provided from a $\overline{Q}$ output of the flip-flop 16 is applied to a flip-flop 18. Outputs of these flip-flops 17 and 18 are supplied to low-pass filters 19 and 20 and a cosine signal cos $\omega t$ and a sine signal sin $\omega t$ are derived from these outputs through amplifiers 21 and 22 and applied to the primary windings W1 for the respective phases A through D of the first and second heads 1 and 2. M count in the counter 13 corresponds to a phase angle of $2\pi$ radian of these reference signals cos $\omega t$ and sin $\omega t$. That is to say, one count of the counter 13 represents $2\pi/M$ radian.

The composite outputs signals Y1 and Y2 of the secondary windings W2 of the respective phases of the first and second heads 1 and 2 are applied to comparators 25 and 26 through amplifiers 23 and 24 and square wave signals corresponding to positive and negative polarities of the signals Y1 and Y2 are respectively provided by the comparators 25 and 26. In response to rising of the output signals of these comparators 25 and 26, pulses T1 and T2 are produced by rise detection circuits 27 and 28. In response to these pulses T1 and T2, the count of the counter 13 is loaded in the registers 14 and 15. As a result, the digital value D$\phi$ corresponding to the phase shift $\phi$ in the first head output signal Y1 is loaded in the register 14 and the digital value D$\theta$ corresponding to the phase shift $\theta$ in the second head output signal Y2 is loaded in the register 15. In this manner, the data D$\phi$ representing a rotational position within the predetermined angular range (360/N degrees) in an absolute value and the data D$\theta$ representing a rotational position within the wider range (360 degrees) in an absolute value can be obtained.

Information which is essentially required in the data D$\theta$ is one representing the cycle number of the current data D$\phi$ in the one rotation. If, for example, the number of repeating cycle of the data D$\phi$ in one rotation, is N, result of dividing the value of the data D$\theta$ by N is the cycle number of the current data D$\phi$. Accordingly, by combining the value obtained by dividing the data D$\theta$ by N and the data D$\phi$, an absolute position over the complete one rotation can be accurately detected with a high resolution. If $N = 2^n$, no particular division is required but more significant n bits of the data D$\theta$ and the data D$\phi$ may be combined.

Figure 5:
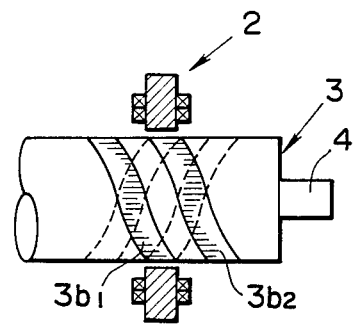
FIG. 5 is a side view showing a spiral pattern of a double thread type as another example of the second pattern disposed on the rotor section.
Figure 6:
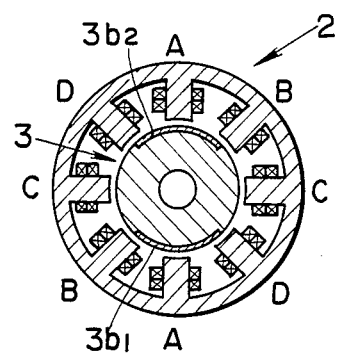
FIG. 6 is a cross sectional view showing an eight-pole type detection head as another example of the second detection head used for detecting the pattern of FIG. 5.

The configuration of the first pattern or the second pattern disposed on the rotor section 3 is not limited to the above described one but any suitable configuration may be utilized. For example, the second pattern may be formed by two strips 3b1 and 3b2 in the form of a double-threaded screw as shown in FIG. 5. In this case, the strips 3b1 and 3b2 are disposed in diametrically opposed positions as viewed in the cross section of the rotor section 3 so that the second detection head 2 should preferably consist of an eight-pole type core as shown in FIG. 6. The eight-pole type core includes a pair of poles for each of the phases A, B, C and D and poles for the same phase are disposed in diametrically opposed positions. In the same manner as was previously described, primary and secondary windings are wound about each pole and, if detection is made by the phase system, the A and C phases and the B and D phases are excited by AC signals which are different in phase by 90 degrees (e.g., a sine signal and a cosine signal). In this case, since the same phase occupies diametrically opposed positions, no error is produced even if the center of the head 2 is offset slightly from the center of the rotor section 3. For convenience in illustration, the first pattern 3a and the first detection head 1 are not illustrated in FIG. 5 but they are of course provided on the rotor section 3 as shown in FIG. 1.

Figure 7:
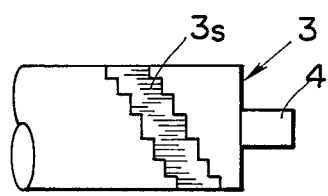
FIG. 7 is a side view showing another example of the spiral pattern disposed on the rotor section which pattern changes stepwise.

The spiral pattern need not consist of a smooth spiral strip such as strips 3b, 3b1 and 3b2 but may consist of a stepwisely disposed pattern 3s as shown in FIG. 7. In short, it will suffice if the pattern exhibits change which more or less resembles a spiral.

Figure 8:
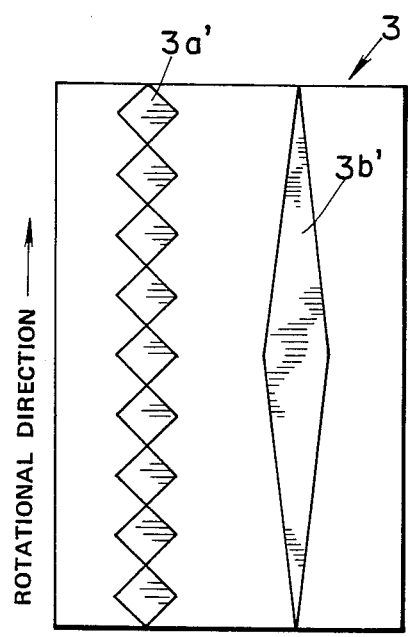
FIG. 8 is a developed view showing another example of the first and second patterns disposed on the rotor section.

FIG. 8 shows another example of the patterns disposed on the rotor section 3 in a developed view. The first pattern consists of rhombic pieces 3a' which are disposed N per one circumference and the second pattern consists of a rhombic piece 3b' which is disposed one per one circumference. In this case also, the areas of the respective patterns 3a' and 3b' opposing to the detection heads 1 and 2 change in accordance with the rotational position and performs the same function as described above.

Figure 9:
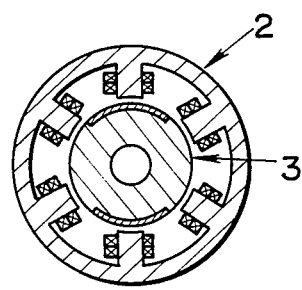
FIG. 9 is a cross sectional view of a six head type detection head which is another example of the detection head.

The detection head is not limited to the above described four-pole type or eight-pole type one but a detection head of other pole type such as a three-pole type, six-pole type or twelve-pole type may also be employed. By way of example, a head of a six-pole type is shown in FIG. 9. In this example, the primary coil exciting AC signals used for the phase detection system are not signals such as a sine signal and a cosine signal which are out of phase by 90 degrees but AC signals such as sin t on one hand and sin ($\omega t-60$) or sin ($\omega t-120$) or sin ($\omega t-240$) on the other, which are out of phase by 60 degrees or its multiples or AC signals which are out of phase by a suitable phase angle.

For the magnetic substance core material of the detection head, either material consisting of separate pieces for the respective poles as shown in FIG. 2 or one by which the respective poles become continuous by a common core material as shown in FIG. 6 may be employed.

In the above described embodiments, the position detection data is obtained according to the phase difference measuring system. Alternatively, position detection data having a voltage level corresponding to the position may be obtained in accordance with a voltage measuring system as is well known by a conventional differential transformer. In that case, the provision of the phase difference in the AC signals for exciting the primary coils is unnecessary. Further, an arrangement may be made so that the position detection data D$\phi$ which requires a high degree of accuracy is obtained by the phase difference measuring system and the other position detection data is obtained by the voltage measuring system.

Taking some examples, the manner of forming the patterns on the rotor section 3 will now be described. Material of a good conductor or magnetic substance for constituting the patterns 3a, 3b, 3b1 and 3b2 may be deposited or formed on the rod section 3 by utilizing a suitable surface treatment technique (such as electroplating, flame spraying, baking, coating, solvent welding, vapor deposition, electroforming and photoetching). There have recently been established microprocessing techniques according to which the minutest pattern can be formed by utilizing the above mentioned surface treatment techniques so that a precise pattern can be formed by employing such techniques.

FIG. 10 shows an example in which a base member 3d of the rod section 3 is formed thereabout with the patterns 3a and 3b made of a good conductor such as copper and is provided thereon with a surface coating 3e by means of, e.g., plating with chromium. For forming the patterns, the base member 3d is plated on its entire circumferential surface with copper and thereafter an unnecessary portion is removed by a removing technique such as etching to form the desired patterns 3a and 3b with the remaining plated portion. Lastly, the surface coating 3e such as plating with chromium is applied for finishing the surface. Magnetic substance such as iron is a suitable material for the base member 3d because it facilitates passing of flux therethrough. Resins such as plastics and other materials may also be used as the base member 3d. In the case where plastic is used, the surface of the preformed plastic base member 3d may be plated with metal, e.g., copper, or a metal film such as a copper film may be preformed on a metal cavity by means of electroforming and thereafter plastic may be injection molded to be integrated with the metal film.

If the surface coating is made in such a manner that the recesses between the patterns 3a are filled with the surface coating 3e as shown in FIG. 10, the coating 3e tends to sink with resulting difficulty in obtaining a smooth surface finishing. Therefore, as shown in FIG. 11, the recesses between the patterns 3a are preferably filled with suitable pads 3f and the surface coating 3e is applied thereon. The pads 3f may be formed by, e.g., plating with nickel.

In the case where the base member 3d is plated with a metal such as copper and thereafter etching is applied in a desired pattern, there is a likelihood that the surface of the base member 3d is corroded by the etching agent used. Particularly so if the base member 3d is made of a metal such as iron. For overcoming this problem, as shown in FIG. 12, a thin film of a predetemined material 3g (e.g., resin) which exhibits strong resistivity to the etching agent is preferably formed on the entire surface of the base member 3d, plating with copper is applied thereon and thereafter etching is applied to form the patterns 3a.

In forming the first pattern and the second pattern in a mixed state on the rod section 3, a composite pattern of the two patterns may be formed at once or, alternatively, one pattern may be formed first and the other pattern may be formed thereon in an overlapping fashion.

The material constituting the patterns is not limited to a good conductor such as copper or aluminum or a mixture or a compound thereof which produces reluctance change by the eddy current loss but may be magnetic substance (e.g., iron or a compound or mixture thereof) which produces reluctance change due to the change in permeability. In the case where the patterns are formed with such magnetic substance, the patterns can be formed by selectively empolying the various surface treatment techniques described above.

As shown in FIG. 13, a desired pattern may be formed by constituting the base member 3d of the rotor section 3 of magnetic substance such as iron, forming recesses corresponding to the desired pattern on the base member 3d by machining it and filling these recesses with a good conductor 3a. In this case, the projecting portions of the base member 3d consisting of magnetic substance enter the intervals between the patterns of the good conductors 3a and, in these portions, reluctance change which is small due to relatively small eddy current loss becomes further smaller due to projection of the magnetic substance whereby accuracy in response of the sensor output signal to the displacement of the rotor section is improved in a synergistic manner. Further, as shown in FIG. 14, projecting portions 3a corresponding to a desired pattern may be formed by machining on the surface of the base member 3d consisting of magnetic substance of the rotor section 3 and these projections 3a may be used as the patterns consisting of magnetic substance. In this case, reluctance change corresponding not to eddy current loss but to permeability change can be produced.

The patterns disposed on a pattern provided member need not be visibly distinguishable but have only to be distinguished from the rest of portion in its magnetic characteristic. For example, by making the base member of the rotor section 3 with stainless steel and heating this base member of stainless steel locally by suitable means such as laser beam in accordance with a desired pattern, the heated portion is converted to magnetic substance. Thus, the portion of the pattern can be made a magnetic substance portion while the rest of portion remains a non-magnetic substance portion notwithstanding that the pattern and the base member are both made of stainless steel.

In the above described embodiments, the primary windings and secondary windings for the respective phases in the detection heads need not be separate windings but may be common ones as those described in Japanese Preliminary Utility Model Publication No. 2621/1983 or No. 35907/1983.

The detection heads need not be provided separately for the first and second patterns but a common detection head may be used for disposing the first and second patterns thereon. In that case, an arrangement should be made by a suitable electrical processing so that output signals responding separately to the first and second patterns can be obtained. The first and second patterns may be disposed in the same area, with one pattern overlapping the other, instead of being disposed in different areas.

As described in the foregoing, according to the invention, two types of patterns are disposed in parallel on a single cylindrical member of a rotor section and positional relation of detection heads with respect to the rotor section is detected separately for each pattern so that the construction is made simple and manufacturing is easy and inexpensive. Moreover, the device according to the invention is suitable for a compact design of the rotor section and enables detection of an absolute rotational position over the complete circumference of one rotation with a high resolution.

We claim:

1. An absolute rotational position detection device comprising:

a rotor section having a single cylindrical member having a first pattern, disposed along the circumference of the cylindrical member, which repeats change in the circumferential direction with a predetermined pitch, and a second pattern, disposed along the circumference of the cylindrical member parallel to the first pattern, which has a change of one cycle with respect to one circumference, said first and second patterns being formed with a predetermined material, said first and second patterns being independent of each other;

a detection head section provided in proximity to said rotor section, whose position relative to the rotor section changes along the circumferential direction of the first and second patterns and which, as a result of changing relative position of the rotor section with respect to the detection head section, produces first and second cyclic output signals representing electrical phase change whose respective cycles are constituted of one pitch of the respective patterns; and means for obtaining first absolute position data whose cycle corresponds to one pitch of the first pattern by measuring electrical phase difference between the first output signal and a predetermined reference AC signal and obtaining second absolute position data whose cycle corresponds to one pitch of the second pattern by measuring electrical phase difference between the second output signal and the reference AC signal and thereby providing, responsive to said first and second absolute position data, data specifying absolute rotational position of said rotor section with respect to said detection head section.

2. An absolute rotational position detection device as defined in claim 1 wherein said predetermined material constituting said first and second patterns consists of a relatively better conductor than the material of the remaining portion of said rotor section.

3. An absolute rotational position detection device as defined in claim 1 wherein said predetermined material constituting said patterns consists of a magnetic substance.

4. An absolute rotational position detection device as defined in claim 3 wherein a base member of said rotor section consists of magnetic substance and said first and second patterns consisting of magnetic substance are formed as projecting portions on said base member.

5. An absolute rotational position detection device as defined in claim 2 wherein a base member of said rotor section consists of a magnetic substance and recesses are formed in said base member corresponding to said first and second patterns and said predetermined material consisting of a relatively better conductor is buried in said recesses to form said first and second patterns.

6. An absolute rotational position detection device as defined in claim 1 wherein said rotor section has said first and second patterns formed with said predetermined material on a base member and has a predetermined surface coating applied on said first and second patterns.

7. An absolute rotational position detection device as defined in claim 1 wherein said rotor section includes a base member on which first and second patterns are formed as projecting portions of said predetermined material with the recesses between said projecting portions being filled with a predetermined pad material to make the projecting portions coextensive with said pad material and said rotor section has a surface coating applied over the circumference thereof.

8. An absolute rotational position detection device as defined in claim 1 wherein said rotor section includes a base member and said first and second patterns are made of the same material as the base member and a predetermined processing is applied locally to said base member to alter the magnetic property of said base member where the processing is applied and thereby form said patterns.

9. An absolute rotational position detection device as defined in claim 8 wherein said base member is made of stainless steel, said predetermined processing is heating and said predetermined processing to form said patterns alters the magnetic property of the stainless steel to a magnetic substance whereby said first and second patterns are made of magnetic substance.

10. An absolute rotational position detection device as defined in claim 1 wherein said detection heads consist of an induction type detection head comprising exciting winding means and outputting winding means.

* * * * *